(12) United States Patent
Engelhardt et al.

(10) Patent No.: US 10,820,449 B2
(45) Date of Patent: Oct. 27, 2020

(54) ELECTRONIC CHASSIS WITH HEAT EXCHANGER

(71) Applicant: GE AVIATION SYSTEMS LLC, Grand Rapids, MI (US)

(72) Inventors: Michel Engelhardt, Woodbury, NY (US); Ning Liu, Rexford, NY (US)

(73) Assignee: GE Aviation Systems LLC, Grand Rapids, MI (US)

( * ) Notice: Subject to any disclaimer, the term of this patent is extended or adjusted under 35 U.S.C. 154(b) by 0 days.

(21) Appl. No.: 16/552,660

(22) Filed: Aug. 27, 2019

(65) Prior Publication Data
US 2020/0029468 A1 Jan. 23, 2020

Related U.S. Application Data

(63) Continuation of application No. 16/040,091, filed on Jul. 19, 2018, now Pat. No. 10,455,740.

(51) Int. Cl.
| H05K 7/20 | (2006.01) |
| H05K 7/14 | (2006.01) |
| B64D 13/06 | (2006.01) |

(52) U.S. Cl.
CPC ....... *H05K 7/20545* (2013.01); *H05K 7/1412* (2013.01); *H05K 7/20409* (2013.01); *B64D 2013/0614* (2013.01); *B64D 2013/0618* (2013.01)

(58) Field of Classification Search
CPC .... H01L 23/467; F02B 29/04; F02B 29/0418; F02B 29/0475; F02B 37/16; G06F 1/20; G06F 1/206; F02D 41/0007; F02D 41/144; G11B 33/142
See application file for complete search history.

(56) References Cited

U.S. PATENT DOCUMENTS

| 4,628,992 A * | 12/1986 | Kennedy ............ H05K 7/20145 165/123 |
| 4,674,704 A | 6/1987 | Altoz |
| 4,934,154 A | 6/1990 | Altoz |
| 5,201,182 A | 4/1993 | Grignon |
| 5,400,217 A | 3/1995 | Whitson |
| 5,402,319 A | 3/1995 | Shumaker |
| 5,505,533 A | 4/1996 | Kammersgard |
| 6,127,758 A | 10/2000 | Murry |
| 6,164,369 A | 12/2000 | Stoller |

(Continued)

FOREIGN PATENT DOCUMENTS

| CN | 203133734 U | 8/2013 |
| EP | 2983460 A1 | 2/2016 |
| GB | 2145290 A | 3/1985 |

OTHER PUBLICATIONS

European Patent Office, European Search Report re Application No. 19185693.9-1203, dated Dec. 16, 2019, 11 pages, Munich, Germany.

(Continued)

*Primary Examiner* — Adam B Dravininkas
(74) *Attorney, Agent, or Firm* — McGarry Bair, P.C.

(57) ABSTRACT

Aspects of the disclosure generally relate to at least one device for heat transfer or dissipation. The at least one device for heat transfer or dissipation can include an air-to-air heat exchanger. The air-to-air heat exchanger can include an air flow inlet and various slots to establish a flow-through air path.

20 Claims, 5 Drawing Sheets

(56) References Cited

U.S. PATENT DOCUMENTS

| | | |
|---|---|---|
| 6,797,879 B2 | 9/2004 | Leyda |
| 8,035,956 B2 | 10/2011 | Davison |
| 8,882,454 B2 | 11/2014 | Chrabascz |
| 8,887,486 B2 | 11/2014 | Rosen |
| 9,832,910 B2 | 11/2017 | Pal |
| 9,878,793 B2 | 1/2018 | Beers |
| 10,455,740 B1* | 10/2019 | Engelhardt ........ H05K 7/20572 |
| 2005/0259392 A1 | 11/2005 | Vinson et al. |
| 2006/0133033 A1 | 6/2006 | Straub et al. |
| 2007/0070601 A1 | 3/2007 | Vos et al. |
| 2007/0086158 A1 | 4/2007 | Hartung |
| 2009/0112368 A1 | 4/2009 | Mann, III et al. |
| 2010/0073872 A1 | 3/2010 | Pakravan |
| 2010/0206988 A1 | 8/2010 | Woodland |
| 2010/0321892 A1* | 12/2010 | Vander Ploeg ...... H05K 9/0062 361/707 |
| 2013/0101402 A1 | 4/2013 | Rosen |
| 2013/0294028 A1 | 11/2013 | Lafont et al. |
| 2013/0320574 A1 | 12/2013 | Sickinger et al. |
| 2015/0201527 A1* | 7/2015 | Stringer ............. H05K 7/20009 165/80.3 |
| 2017/0112018 A1 | 4/2017 | Krivonak |
| 2018/0029722 A1 | 2/2018 | Marks |
| 2018/0124953 A1 | 5/2018 | Engelhardt et al. |
| 2019/0368595 A1* | 12/2019 | Liou .................... F04D 25/082 |

OTHER PUBLICATIONS

Chinese Patent Office, Office Action re Corresponding Application No. 201910656212.8, dated May 11, 2020, 8 pages, China.

* cited by examiner

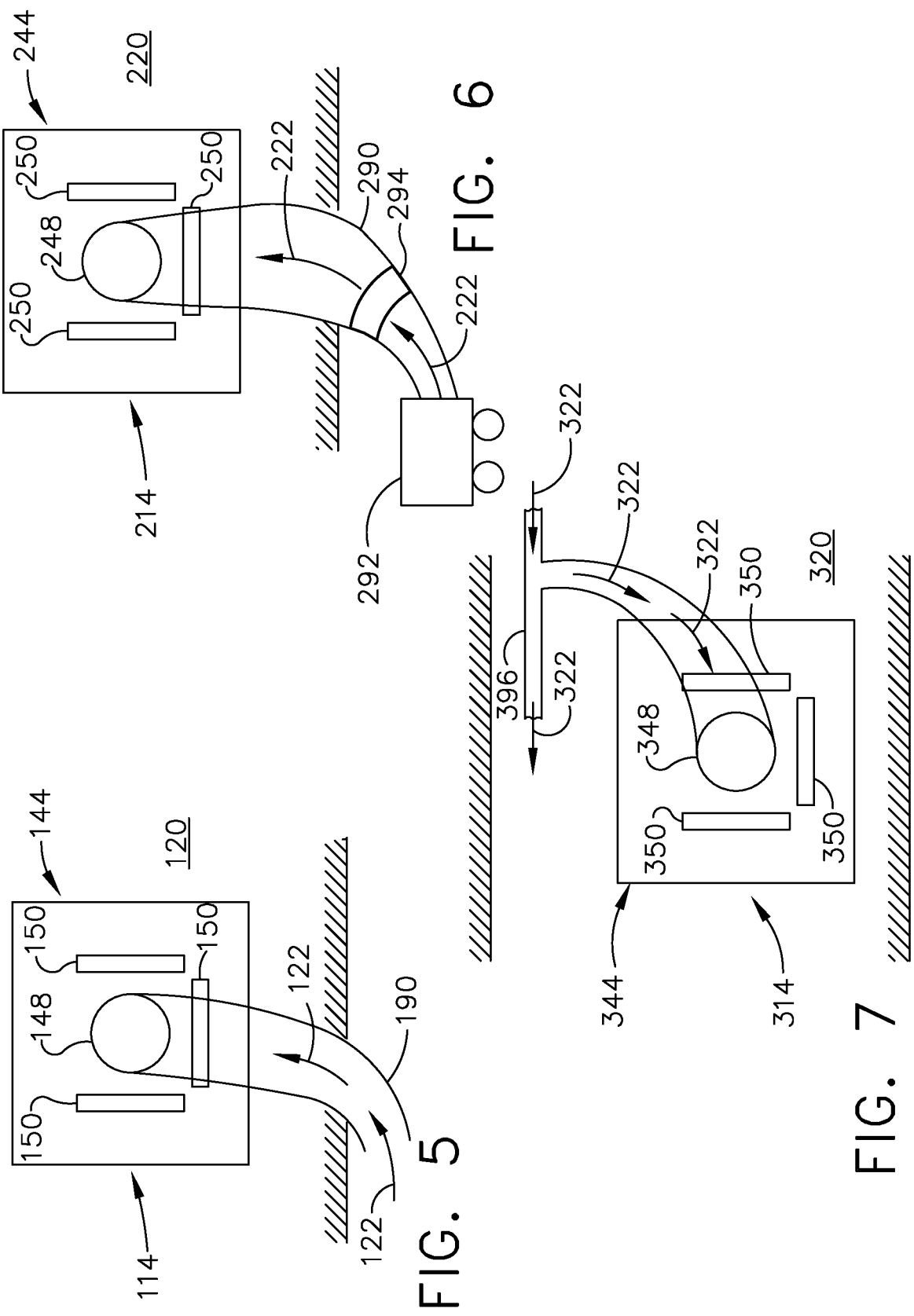

ELECTRONIC CHASSIS WITH HEAT EXCHANGER

CROSS REFERENCE TO RELATED APPLICATION

The present application is a continuation of U.S. patent application Ser. No. 16/040,091, filed Jul. 19, 2018, now U.S. Pat. No. 10,455,740, issued Oct. 22, 2019 and now allowed, which is incorporated herein by reference in its entirety.

Contemporary power systems such as those utilized in aircrafts can use avionics in order to control the various equipment and operations for flying the aircraft. The avionics can include electronic components carried by a circuit board. The avionics or the circuit boards can be stored in an electronic chassis, for example an avionics chassis, which performs several beneficial functions including protecting the avionics from lightning strikes, dissipating the heat generated by the avionics or electronic components, and protecting the avionics from environmental exposure.

Avionics can produce high heat loads and traditional devices for heat dissipation can introduce an appreciable amount of extra weight to the aircraft.

BRIEF DESCRIPTION

In one aspect of the present disclosure, an aircraft electronics chassis comprises: an electronics housing defining a space for at least one electronic component; an air-to-air heat exchanger thermally coupled to at least a portion of the electronics housing and having a flow-through air path; and a plenum coupled to the housing and defining a plenum chamber that is fluidly isolated from the space and fluidly coupled to the flow-through air path, the plenum having an air flow inlet and at least one entrainment slot, which are fluidly coupled to the plenum chamber.

In another aspect of the present disclosure, an aircraft electronics chassis comprises: an electronics housing defining an space for at least one electronic component; an air-to-air heat exchanger thermally coupled to at least a portion of the electronics housing and having a flow-through air path; and a plenum coupled to the housing and defining a plenum chamber that is fluidly isolated from the space and fluidly coupled to the flow-through air path, the plenum having an air flow inlet fluidly coupled to the plenum chamber, and at least one entrainment slot fluidly coupled to the plenum chamber.

BRIEF DESCRIPTION OF THE DRAWINGS

In the drawings:

FIG. 5 is a schematic view of a portion of the air-to air heat exchanger of FIG. 2 according to one aspect of the present disclosure.

FIG. 6 is a schematic view of a portion of the air-to air heat exchanger of FIG. 2 according to another aspect of the present disclosure.

FIG. 7 is a schematic view of a portion of the air-to air heat exchanger of FIG. 2 according to yet another aspect of the present disclosure.

DETAILED DESCRIPTION

Figure 1:
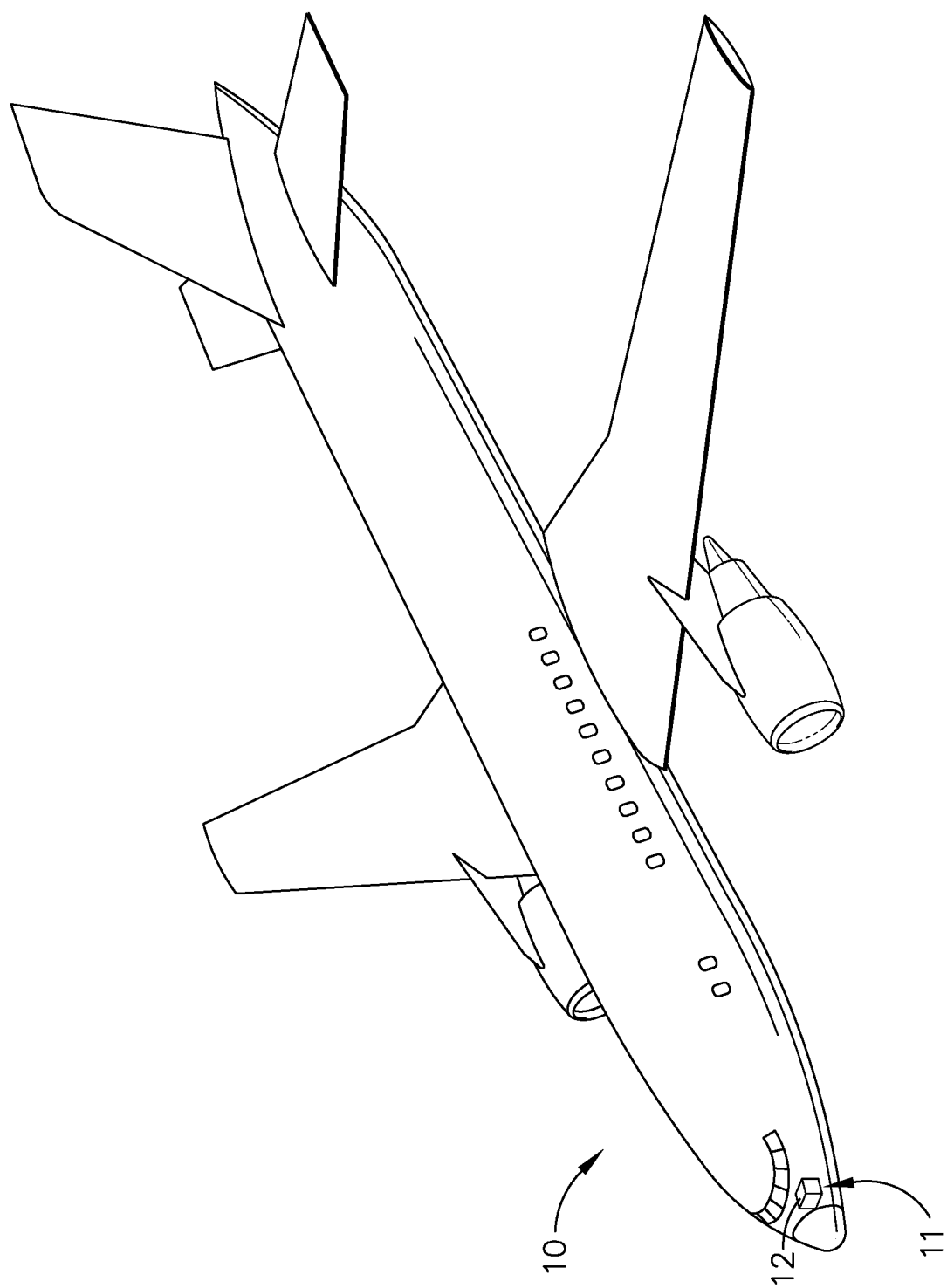
FIG. 1 is a perspective view of an aircraft having an electronics chassis in accordance with various aspects described herein.

Aspects of the present disclosure describe an approach to cool at least one aircraft electronic chassis using an air-to-air heat exchanger that is thermally coupled an electronic housing of the aircraft electronics chassis. It will be understood, however, that the present disclosure is not so limited and can have general applicability in non-aircraft applications or vehicles that include electronics chassis.

While "a set of" various elements will be described, it will be understood that "a set" can include any number of the respective elements, including only one element. All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are only used for identification purposes to aid the reader's understanding of the present disclosure, and do not create limitations, particularly as to the position, orientation, or use of aspects of the disclosure described herein. Connection references (e.g., attached, coupled, connected, secured, fastened, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the dimensions, positions, order and relative sizes reflected in the drawings attached hereto can vary.

FIG. 1 schematically illustrates an aircraft 10 with a thermal management member 11, illustrated as an on-board electronics chassis 12 (shown in phantom) for housing avionics or avionics components for use in the operation of the aircraft 10. It will be understood that the thermal management member 11 can also include heat spreaders, heat sinks, heat exchanger, radiators, or heat pipes in non-limiting examples. The electronics chassis 12 can house a variety of avionics elements and protects them against contaminants, electromagnetic interference (EMI), radio frequency interference (RFI), vibrations, and the like. Alternatively or additionally, the electronics chassis 12 can have a variety of avionics mounted thereon. It will be understood that the electronics chassis 12 can be located anywhere within the aircraft 10, not just the nose as illustrated.

While illustrated in a commercial airliner, the electronics chassis 12 can be used in any type of aircraft, for example, without limitation, fixed-wing, rotating-wing, rocket, commercial aircraft, or personal aircraft. Furthermore, aspects of the disclosure are not limited only to aircraft aspects, and can be included in other mobile and stationary configurations. Non-limiting example mobile configurations can include ground-based, water-based, or additional air-based vehicles.

Figure 2:
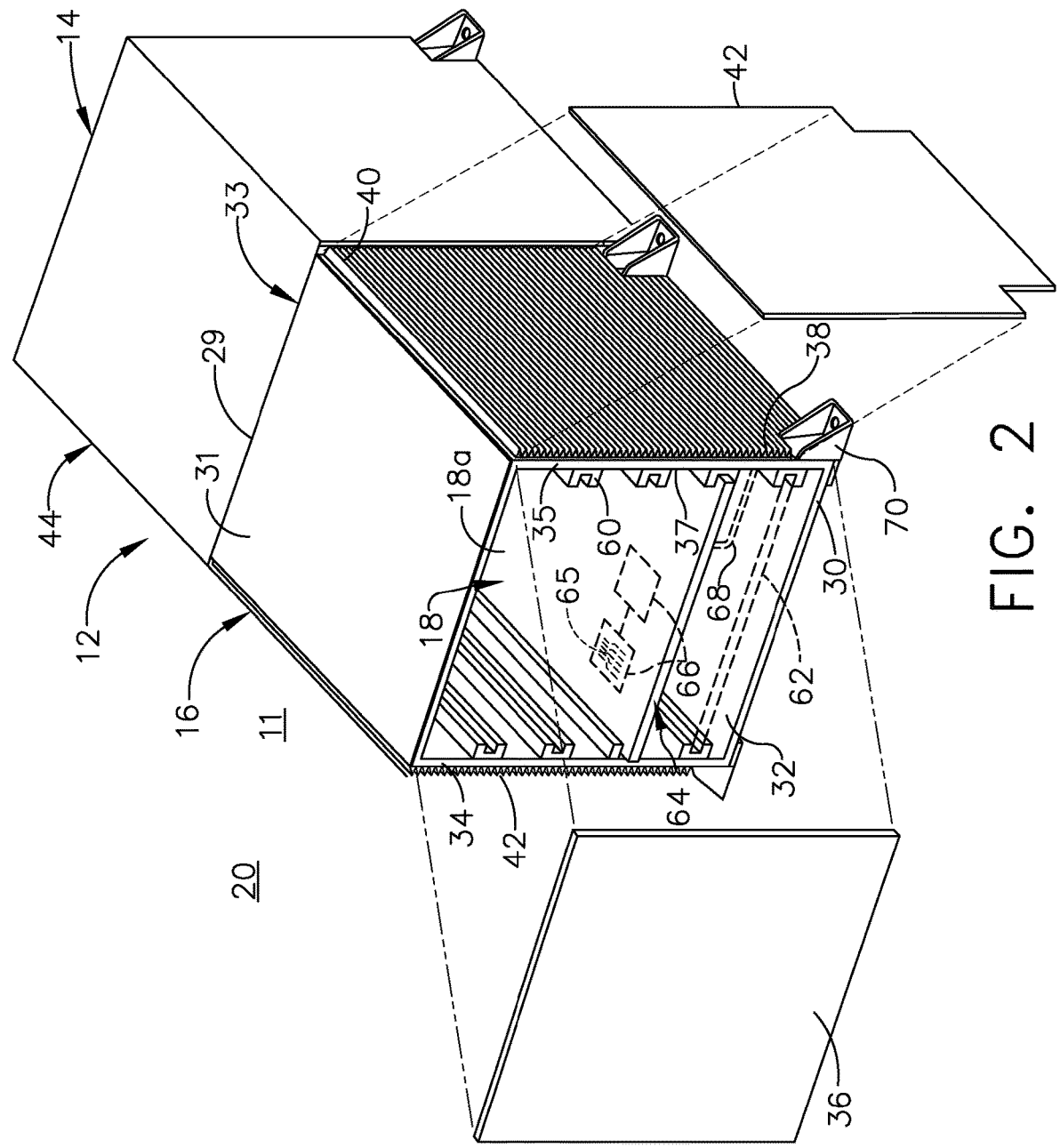
FIG. 2 is a front perspective view of an exemplary electronics chassis of FIG. 1 including an air-to air heat exchanger in accordance with various aspects described herein.

FIG. 2 illustrates the electronics chassis 12 in further detail, where the electronics chassis 12 can include an electronics housing 16 thermally coupled to an air-to-air heat exchanger 14. The electronics chassis 12 can define an interior 18 and an exterior 20. The interior 18 of the electronics chassis 12 can include a housing portion 18a and a heat exchange portion 18b. The electronics housing 16 can include a chassis frame 30 having a back plane 29, a top cover 31, a bottom wall 32, and opposing side walls 34, 35 that can define a space for at least one electronic component in the housing portion 18a of the interior 18. The back plane 29 can form a back wall 33.

The chassis frame 30 can further include a removable front cover 36, providing access to the interior 18 of the electronics housing 16 when removed, and at least partially restricting access to the interior 18 when coupled or mounted to the chassis frame 30. In addition, the side walls 34, 35 of the electronics housing 16 can include an interior surface 37 and an exterior surface 38. It is contemplated that the electronics chassis 12 and any components thereof can be formed from any suitable material.

The air-to-air heat exchanger 14 thermally couples to the electronics housing 16 and has a flow-through air path 22. The heat exchanger 14 can be fixedly or removably mounted to the electronics housing 16. In non-limiting examples, the heat exchanger 14 can be slidably mounted, clasped, or otherwise overlie or couple to one or more side walls 34, 35 or, as illustrated, the back wall 33 of the electronics housing 16. The heat exchanger 14 can include a plenum 44. In a non-limiting example, the plenum 44 can overlie at least a portion of one or more walls 31, 32, 33, 34, or 35 of the chassis frame 30. The plenum 44 is illustrated as having a generally cubic shape, however, it is contemplated that the plenum 44 can be any three-dimensional shape optionally including one or more contours, irregularities, or symmetries.

A set of fins 40 includes multiple fins. The set of fins 40 project from the exterior surface 38 of the side walls 34, 35 of the electronics housing 16. The set of fins 40 can also be formed of any suitable material. While the set of fins 40 are shown on the side walls 34, 35, of the electronics housing 16, the set of fins 40 can be disposed on any exterior portion of the electronics housing 16 such as the back wall 33, the top cover 31 or the bottom wall 32 in additional non-limiting examples. While the set of fins 40 are shown extending fully along the side walls 34, 35, it should be appreciated that the set of fins 40 need not extend the full length of the side walls 34, 35, and can be organized in other configurations. It is also contemplated that the set of fins 40 can extend from the electronics housing 16 to the heat exchanger 14. The fins 40 can have a cover 42. The cover 42 can be removably coupled to electronics chassis 12.

By way of non-limiting example, it is contemplated that air can be provided along the set of fins 40 to move the heat away. The air can be provided by the heat exchanger 14 or other known methods of providing air flow. It is further contemplated that heat introduced to the exterior 20 of the electronics chassis 12 will dissipate by convection.

The electronics chassis 12 can further include a set of card rails 60 within the interior 18 and supported by the interior surface 37 of the side walls 34, 35 of the electronics housing 16. The set of card rails 60 can be horizontally aligned on the interior surfaces 37 and spaced on opposing side walls 34, 35 to define effective card slots 62 (illustrated by the phantom lines) for receiving at least a portion of an electronic component, illustrated by way of non-limiting example as an avionics system card 64. Alternatively, the set of card rails 60 can be aligned vertically. Each avionics card 64 can include a set of wires 65. The set of wires can be formed of any suitable material. At least one heat producing component 66 can be included on the avionics system card 64. It should be understood that the set of wires 65 can be used within the heat producing component 66, or to connect multiple heat producing components 66, or anywhere else within or on the avionics system card 64 as desired. In addition, while only one avionics system card 64 is shown, the electronics chassis 12 can be configured to house, support, or include any number of avionics system cards 64.

Optionally, one or more heat pipes or heat spreaders 68 can be utilized to transfer at least a portion of the heat from one or more heat producing components 66 to another location that can include, but is not limited to, one or more side walls 34, 35, the back wall 33, the bottom wall 32, the top cover 31, the set of fins 40, or another desired location in the interior 18 or the exterior 20 of the electronics housing 16 or the heat exchanger 14.

A set of mounting feet 70 can extend from the electronics chassis 12 to facilitate mounting the electronics chassis 12 to the aircraft 10 by means of bolts or other conventional fasteners. Further, the set of mounting feet 70 can function as an electrical ground to ground the electronics chassis 12 to the frame of the aircraft 10. While the set of mounting feet 70 are shown in this example, the electronics chassis 12 can be used with many types of attachment mechanism.

Figure 3:
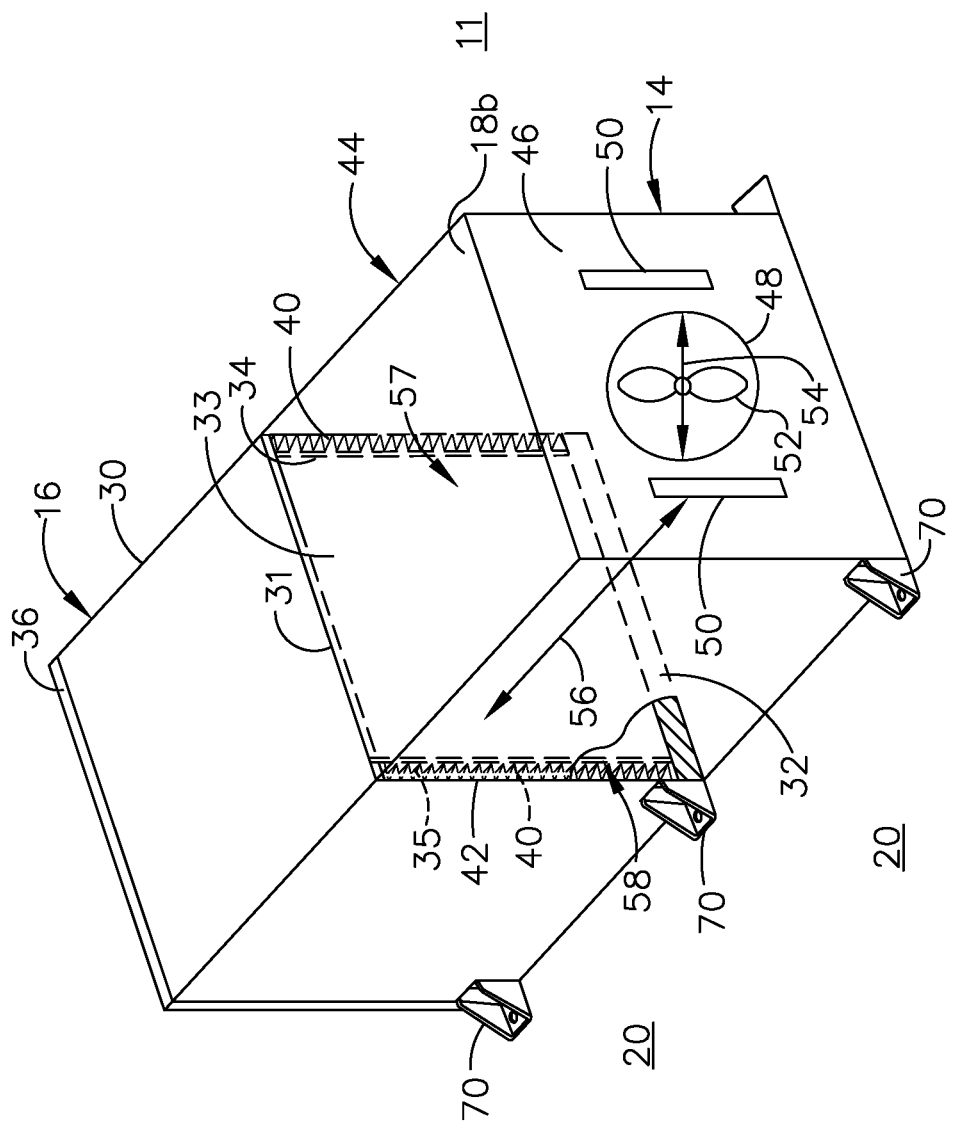
FIG. 3 is a rear perspective view of the exemplary electronics chassis of FIG. 2.

FIG. 3 illustrates a rear perspective of the electronics chassis 12 in further detail. The back wall 33 extends between side walls 34, 35. The back wall 33 forms a first junction 57 with the side wall 34. The back wall 33 forms a second junction 58 with the side wall 35.

A plenum chamber 46 can be defined by the plenum 44 and one or more walls 31, 32, 33, 34, or 35 of the chassis frame 30 that couple to the plenum 44. As illustrated, the plenum 44 couples to the back wall 33 to form a non-limiting example of the plenum chamber 46.

The plenum chamber 46 includes an air flow inlet 48 and at least one entrainment slot 50. The air flow inlet 48 can include a fan 52. It is contemplated that the fan 52 can use blades or other known methods of driving air from the exterior 20 into the heat exchange portion 18b of the interior 18.

The air flow inlet 48 is illustrated, in a non-limiting example, as having a circular shape with an inlet diameter D 54. It is also contemplated that the air flow inlet 48 can have a non-circular shape. When the inlet 48 has a non-circular shape, the corresponding inlet diameter D 54 will be the diameter of a circle having the same area as the non-circular inlet.

The at least one entrainment slot 50 is illustrated, in a non-limiting example, as two entrainment slots 50 symmetric about the air flow inlet 48. It is contemplated that the at least one entrainment slots 50 can include any number of entrainment slots and do not require symmetry to the air flow inlet 48, rather the at least one entrainment slot 50 can be distributed about the plenum 44 in various locations. A distance 56 from the at least one entrainment slots 50 to the electronics housing 16 is at least half of the inlet diameter 54.

Figure 4:
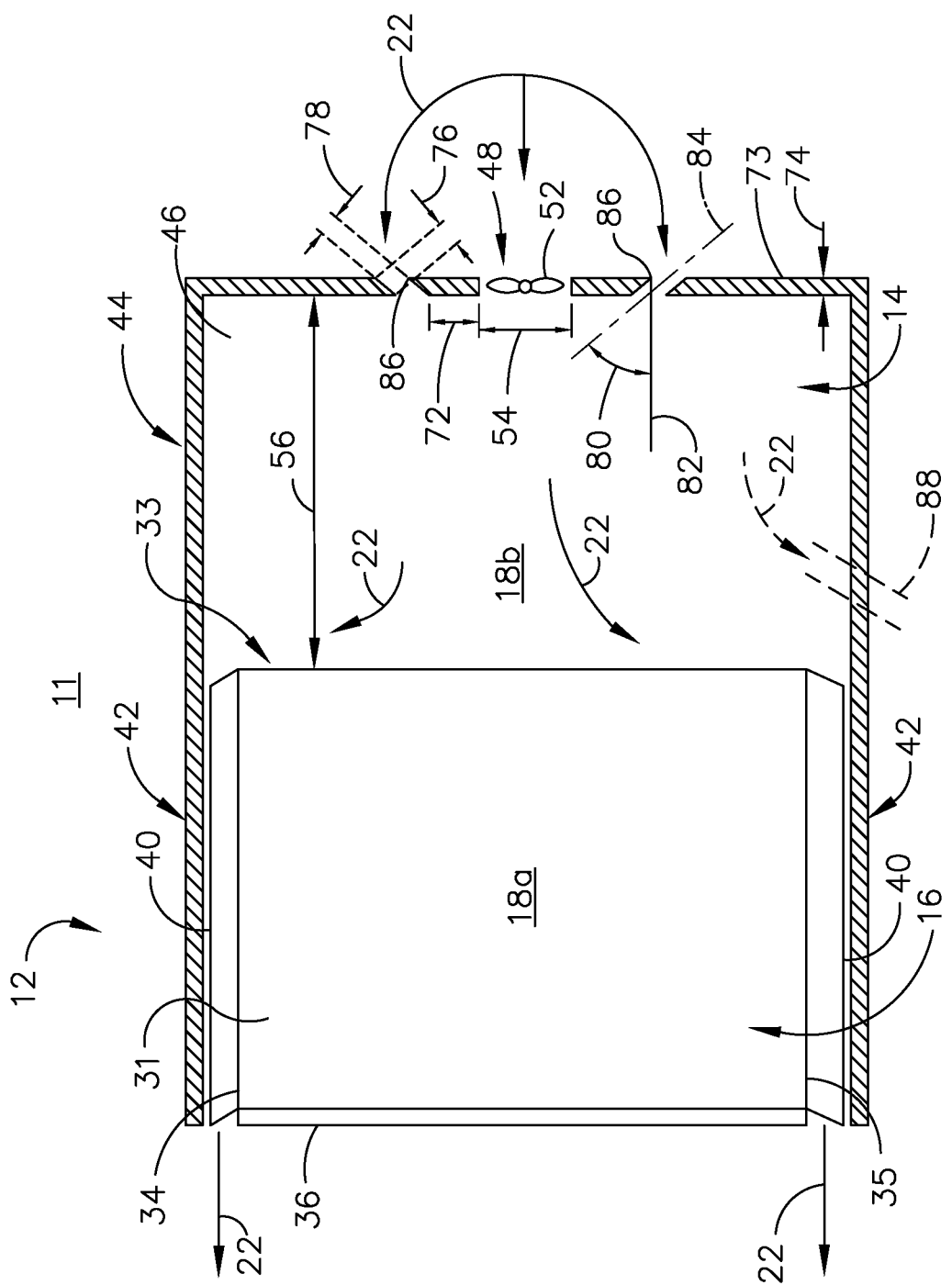
FIG. 4 is a schematic top view of the exemplary electronics chassis of FIG. 2.

FIG. 4 is a schematic top view of the exemplary electronics chassis 12 that illustrates further details of the at least one entrainment slot 50 and flow-through air path 22 of the heat exchanger 14. The at least one entrainment slot 50 is a predetermined distance 72 from the air flow inlet 48. The predetermined distance 72 can, as a non-limiting example, be determined using simulated air flow testing programs. The plenum 44 includes a plenum wall 73 with a local thickness 74 where the at least one entrainment slot 50 is located. The at least one entrainment slot 50 has a length 76. The length 76 can be equal to or greater than the local thickness 74 of the plenum wall 73. The at least one entrainment slot 50 has a hydraulic diameter d 78. One exemplary approximation for determining the hydraulic diameter d 78 is given in Equation (1) below:

$$d = \frac{4A}{P} \quad (1)$$

where A refers to a cross-sectional area of the at least one entrainment slot 50, and P refers to the perimeter of the cross-section of the at least one entrainment slot 50. The hydraulic diameter d 78 can be ten percent of the inlet diameter D 54 or less.

A slot angle 80 can be measured from a normal line 82 to a center line (CL) 84 of the at least one entrainment slot 50. The normal line 82 is perpendicular to the plenum 44 at an inlet edge 86 of the at least one entrainment slot 50. The slot angle 80 can be at least 45°.

The at least one entrainment slot 50 is illustrated as having a parallelepiped shape. It is contemplated that the shape of the at least one entrainment slot 50 can be, but is not limited to, a cuboid or a cylindrical or an irregular shape that can include various contours or symmetry.

The flow-through air path 22, as indicated by arrows, can include the air flow inlet 48, the at least one entrainment slot 50, the plenum chamber 46, and the fins 40 with the cover 42. In operation, as illustrated by a non-limiting example, the flow-through air path 22 can begin by air passing from the exterior 20 to the plenum chamber 46 through the air flow inlet 48 and the at least one entrainment slot 50. The flow-through air path 22 can include the air exiting the plenum chamber 46 through the fins 40 and the cover 42. Additionally or alternatively, the flow-through air path 22 can include the air exiting the plenum chamber 46 through at least one air flow exit 88. The at least one air flow exit 88 can multiple air flow exits and can be located at any part of the plenum 44 or the cover 42.

The housing portion 18a of the interior 18 is fluidly isolated from the flow-through air path 22 by at least a portion of one or more walls 31, 32, 33, 34, or 35 and front cover 36. It is contemplated that a variety of air flow channels can be used in the flow-through air path 22 to couple the plenum 44 to the exterior 20. In a non-limiting example, the air flow channels can flow through or around the housing portion 18a, but remain fluidly isolated from the housing portion 18a.

It is contemplated that the fins 40 and the cover 42 can be geometrically design, so that an air gap defined by the fins 40 and the cover 42 can result in an increase in airflow from the plenum chamber 46 due to entrainment of air through the air gap.

FIG. 5 illustrates a non-limiting example of a schematic view of a portion of a heat exchanger 114 that is substantially similar to the heat exchanger 14. Therefore, like parts will be identified with like numerals increased by 100, with it being understood that the description of the like parts of the heat exchanger 14 apply to the heat exchanger 114 unless otherwise noted.

The heat exchanger 114 includes a plenum 144 with the air flow inlet 148 and the at least one entrainment slot 150. The flow-through air path 122 includes the flow of air through a RAM air scoop 190 that is forced to enter the plenum 144 of the heat exchanger 114 through the air flow inlet 148. Additional air can be drawn into the plenum 144 from an exterior 120 through the at least one entrainment slot 150.

FIG. 6 illustrates yet another non-limiting example of a schematic view of a portion of a heat exchanger 214 that is substantially similar to the heat exchanger 14. Therefore, like parts will be identified with like numerals increased by 200, with it being understood that the description of the like parts of the heat exchanger 14 apply to the heat exchanger 214 unless otherwise noted.

A ground cooling cart 292 couples to a RAM air scoop 290 via a connector 294. A flow-through air path 222 includes air from the ground cooling cart 292 that is forced through the connector 294 into the RAM air scoop 290. From the RAM air scoop 290, the forced air of the flow-through air path 222 enters a plenum 244 of the heat exchanger 214 through an air flow inlet 248. Additional air can be drawn into the plenum 244 from an exterior 220 through the at least one entrainment slot 250.

FIG. 7 illustrates still yet another non-limiting example of a schematic view of a portion of a heat exchanger 314 that is substantially similar to the heat exchanger 14. Therefore, like parts will be identified with like numerals increased by 300, with it being understood that the description of the like parts of the heat exchanger 14 apply to the heat exchanger 314 unless otherwise noted.

An environmental control system (ECS) can include a distribution plenum 396. A flow-through air path 322 can include at least a portion of the air from the distribution plenum 396 that is directed to force air into a plenum 344 of the heat exchanger 314 through an air flow inlet 348. Additional air can be drawn into the plenum 344 from an exterior 320 through the at least one entrainment slot 350.

As described in FIG. 4, FIG. 6, FIG. 7 and FIG. 8, as air is forced into the plenum 44, 144, 244, or 344 the at least one entrainment slot 50, 150, 250, or 350 can draw in additional air by entrainment. However, the entrainment only occurs when the number of slots as well as each slot dimension and location are carefully considered. It is possible, with incorrect dimensions or incorrect location that a slot in the plenum could backflow air rather than draw it in by entrainment.

Aspects of the present disclosure provide for a variety of benefits. For example, the correct combination of entrainments slots and forced or driven air through an inlet can increase the air flow through the plenum significantly (approximately 10%-20%). This improves cooling of electrical components using an air-to-air heat exchanger.

Another advantage of the present disclosure is the fluid isolation of the electrical components from the flow-through air path.

Many other possible configurations in addition to those shown in the above figures are contemplated by the present disclosure. To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the invention, including the best mode, and also to enable any person skilled in the art to practice aspects of the invention, including making and using any devices or systems and performing any incorporated methods. The patentable scope of the invention is defined by the claims, and can include other examples that occur to those skilled in the art.

Such other examples are intended to be within the scope of the claims if they have structural elements that do not differ from the literal language of the claims, or if they include equivalent structural elements with insubstantial differences from the literal languages of the claims.

What is claimed is:

1. An electronics chassis, comprising:
   an electronics housing defining a space for at least one electronic component;
   an air-to-air heat exchanger thermally coupled to at least a portion of the electronics housing and having a flow-through air path fluidly isolated from the space; and
   a plenum coupled to the electronics housing and defining a plenum chamber that is fluidly isolated from the space and fluidly coupled to the flow-through air path, wherein the plenum includes an air flow inlet including a fan and at least one entrainment slot that defines at least a portion of the flow-through air path that extends from the air flow inlet and the at least one entrainment slot to the plenum chamber, whereby operation of the fan introduces air into the plenum chamber by introducing air into the inlet and drawing air through the at least one entrainment slot.

2. The electronics chassis of claim 1 wherein the electronics housing has a first wall and the plenum overlies a portion of the first wall.

3. The electronics chassis of claim 2 wherein the electronics housing has a second wall and the air-to-air heat exchanger overlies at least a portion of the second wall.

4. The electronics chassis of claim 3 wherein the first and second walls define a junction.

5. The electronics chassis of claim 4 wherein the first wall is a back wall and the second wall is a side wall.

6. The electronics chassis of claim 5, further comprising a second air-to-air heat exchanger on a second side wall opposing the second wall.

7. The electronic chassis of claim 5 wherein the electronics housing comprises a back plane forming the back wall.

8. The electronics chassis of claim 1 wherein the at least one entrainment slot comprises multiple entrainment slots.

9. The electronics chassis of claim 8 wherein the multiple entrainment slots are spaced about the air flow inlet.

10. The electronics chassis of claim 1 wherein the at least one entrainment slot is spaced from the air flow inlet a predetermined distance to allow air flow entrainment into the entrainment slot.

11. The electronics chassis of claim 1 wherein the entrainment slot has a length greater than a local thickness of the plenum where the entrainment slot is located.

12. The electronics chassis of claim 1 wherein the entrainment slot has a hydraulic diameter d that is no greater than ten percent of a diameter or 0.1D of the air flow inlet.

13. The electronics chassis of claim 1 wherein the entrainment slot has a slot angle of at least 45 degrees.

14. The electronics chassis of claim 1 wherein the air-to-air heat exchanger comprises multiple fins within the flow-through air path.

15. An electronics chassis, comprising:
    an electronics housing defining a space for at least one electronic component;
    an air-to-air heat exchanger thermally coupled to at least a portion of the electronics housing and having a flow-through air path fluidly isolated from the space; and
    a plenum coupled to the electronics housing and defining a plenum chamber that is fluidly isolated from the space and fluidly coupled to the flow-through air path, the plenum having an air flow inlet fluidly coupled to the plenum chamber, and at least one entrainment slot fluidly coupled to the plenum chamber, wherein the air flow inlet can include or be coupled to a distribution plenum or a ram air scoop, and whereby air is introduced into the plenum chamber via the air flow inlet and drawn into the plenum chamber via the at least one entrainment slot.

16. The electronics chassis of claim 15 wherein the electronics housing comprises a back wall and two opposing side walls extending from the back wall, with the air-to-air heat exchanger overlying a portion of each of the opposing side walls, and the plenum overlying the back wall.

17. The electronics chassis of claim 16 wherein the at least one entrainment slot comprises multiple entrainment slots.

18. The electronics chassis of claim 17 wherein the multiple entrainment slots are spaced about the air flow inlet.

19. The electronics chassis of claim 18 wherein the air-to-air heat exchanger comprises multiple fins within the flow-through air path.

20. The electronics chassis of claim 19 wherein the electronics housing comprises a back plane forming the back wall.

* * * * *